US010050097B2

(12) United States Patent
Oh et al.

(10) Patent No.: US 10,050,097 B2
(45) Date of Patent: Aug. 14, 2018

(54) ORGANIC LIGHT-EMITTING DIODE DISPLAY

(71) Applicant: Samsung Display Co., Ltd., Yongin-si, Gyeonggi-do (KR)

(72) Inventors: Jae Hwan Oh, Cheonan-si (KR); Hyo Jin Kim, Seoul (KR); Ji Hye Park, Seoul (KR); In Jun Bae, Seoul (KR); Woo Ri Seo, Seoul (KR); Hwang Sup Shin, Seongnam-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 15/275,031

(22) Filed: Sep. 23, 2016

(65) Prior Publication Data
US 2017/0117343 A1 Apr. 27, 2017

(30) Foreign Application Priority Data

Oct. 27, 2015 (KR) .................. 10-2015-0149636

(51) Int. Cl.
H01L 27/32 (2006.01)
G09G 3/3258 (2016.01)
G09G 3/3233 (2016.01)

(52) U.S. Cl.
CPC ....... *H01L 27/3272* (2013.01); *G09G 3/3233* (2013.01); *G09G 3/3258* (2013.01); *H01L 27/3248* (2013.01); *H01L 27/3262* (2013.01); *H01L 27/3265* (2013.01); *H01L 27/3276* (2013.01); *G09G 2300/0439* (2013.01); *G09G 2300/0861* (2013.01); *G09G 2310/0251* (2013.01); *G09G 2310/0262* (2013.01); *G09G 2320/043* (2013.01); *G09G 2330/028* (2013.01)

(58) Field of Classification Search
None
See application file for complete search history.

(56) References Cited

U.S. PATENT DOCUMENTS

2007/0159565 A1* 7/2007 Segawa ............ G02F 1/136209
349/38

FOREIGN PATENT DOCUMENTS

| KR | 10-0707608 B1 | 4/2007 |
| KR | 10-2008-0057490 A | 6/2008 |
| KR | 10-1101109 B1 | 12/2011 |
| KR | 10-1210792 B1 | 12/2012 |
| KR | 10-2015-0030325 A | 3/2015 |

* cited by examiner

Primary Examiner — Jack Chen
(74) Attorney, Agent, or Firm — Knobbe Martens Olson & Bear LLP

(57) ABSTRACT

An organic light-emitting diode (OLED) display is disclosed. In one aspect, the display includes a substrate, a plurality of OLEDs provided over the substrate, and a plurality of pixel circuits provided between the substrate and the OLEDs. Each of the pixel circuits comprises a plurality of transistors each including an active pattern electrically connected to the respective OLEDs. A shield layer overlaps the pixel circuits and the active patterns of the transistors in the depth dimension of the OLED display.

16 Claims, 7 Drawing Sheets

ORGANIC LIGHT-EMITTING DIODE DISPLAY

RELATED APPLICATIONS

This application claims priority to and the benefit of Korean Patent Application No. 10-2015-0149636 filed in the Korean Intellectual Property Office on Oct. 27, 2015, the entire contents of which are incorporated herein by reference.

BACKGROUND

Field

The described technology generally relates to an organic light-emitting diode (OLED) display.

Description of the Related Technology

Example types of flat panel displays include OLED displays, liquid crystal displays (LCDs), plasma display panels (PDPs), etc.

An OLED display includes a matrix of pixel circuits and each circuit includes thin film transistors and an OLED connected to the thin film transistors.

The OLED emits light with luminance that corresponds to a voltage supplied to the OLED through the thin film transistor.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display with an improved transistor characteristic of a thin film transistor connected to an OLED.

Another aspect is an OLED display including: a substrate; a plurality of OLEDs provided on the substrate; a plurality of pixel circuits provided between the substrate and the OLEDs and including a plurality of transistors including an active pattern connected to the respective OLEDs; and a shield layer traversing the pixel circuits and overlapping the active pattern of part of the transistors.

The shield layer can include a plurality of shield lines, and the shield lines can be spaced from each other in a first direction and can be extended in a second direction crossing the first direction.

The shield lines can be connected to each other.

The substrate can include: a display area in which the OLEDs are provided; and a non-display area neighboring the display area, and the shield layer can further include a connection line extended in the first direction in the non-display area to be connected to the shield lines.

The shield layer can be provided on a rear side of the substrate.

The OLED display can further include a strengthened substrate provided on the rear side of the substrate, wherein the shield layer can be provided between the substrate and the strengthened substrate.

The substrate can further include a chamfered unit for exposing an end of the strengthened substrate, and the connection line can be exposed by the chamfered unit.

The shield layer can be provided between the substrate and the active pattern.

The shield layer can be provided on a rear side of the substrate.

Power can be supplied to the shield layer.

The transistors can include a first transistor including a first active pattern including a first channel provided on the substrate and a first gate electrode provided on the first active pattern, and the shield layer can overlap the first channel of the first active pattern.

The OLED display can further include a capacitor electrode overlapping the first gate electrode on the first gate electrode and configuring a capacitor together with the first gate electrode, wherein the shield layer can overlap the capacitor electrode.

The transistors can further include: a second transistor including a second active pattern connected to the first active pattern and a second gate electrode provided on the second active pattern; and a third transistor including a third active pattern including a third channel for connecting between the first active pattern and the first gate electrode and a third gate electrode provided on the third active pattern, and the shield layer can overlap the third channel of the third active pattern.

The shield layer may not overlap the second active pattern.

The OLED display can further include: a first scan line provided on the second active pattern to traverse the second active pattern and the third active pattern, and connected to the second gate electrode and the third gate electrode; a data line provided on the first scan line to traverse the first scan line, and connected to the second active pattern; and a driving power supply line provided on the first scan line and spaced from the data line to traverse the first scan line, and connected to the first active pattern.

The transistors can further include a fourth transistor including a fourth active pattern connected to the first gate electrode and the third active pattern, and a fourth gate electrode provided on the fourth active pattern, and the OLED display can further include: a second scan line provided on the fourth active pattern to traverse the fourth active pattern and connected to the fourth gate electrode; and an initialization power supply line provided on the second scan line and connected to the fourth active pattern.

The transistors can further include a seventh transistor including a seventh active pattern connected to the fourth active pattern and a seventh gate electrode provided on the seventh active pattern, and the OLED display can further include a third scan line provided on the seventh active pattern to traverse the seventh active pattern and connected to the seventh gate electrode.

The transistors can further include: a fifth transistor including a fifth active pattern for connecting between the first active pattern and the driving power supply line, and a fifth gate electrode provided on the fifth active pattern; and a sixth transistor including a sixth active pattern for connecting between the first active pattern and the OLED and a sixth gate electrode provided on the sixth active pattern, and the OLED display can further include an emission control line provided on the fifth active pattern and the sixth active pattern to traverse the fifth active pattern and the sixth active pattern, and connected to the fifth gate electrode and the sixth gate electrode.

The shield layer may not overlap at least one of the second active pattern, the fourth active pattern, the fifth active pattern, the sixth active pattern, and the seventh active pattern.

Another aspect is an OLED display including: a substrate; a plurality of OLEDs provided on the substrate; a plurality of pixel circuits including a first transistor including a first active pattern connected to the OLEDs and a first gate electrode provided on the first active pattern, and a third transistor including a third active pattern for connecting between the first active pattern and the first gate electrode; and a shield layer traversing the pixel circuits and overlapping the first active pattern and the third active pattern.

Another aspect is an organic light-emitting diode (OLED) display comprising: a substrate; a plurality of OLEDs provided over the substrate; a plurality of pixel circuits provided between the substrate and the OLEDs, wherein each of the pixel circuits comprises a plurality of transistors each including an active pattern electrically connected to the respective OLEDs; and a shield layer overlapping the pixel circuits and the active patterns of the transistors in the depth dimension of the OLED display.

In the above OLED display, the shield layer includes a plurality of shield lines, wherein the shield lines are spaced apart from each other in a first direction and extend in a second direction crossing the first direction.

In the above OLED display, the shield lines are electrically connected to each other.

In the above OLED display, the substrate includes: a display area comprising the OLEDs; and a non-display area surrounding the display area, wherein the shield layer further includes a connection line extending in the first direction in the non-display area and electrically connected to the shield lines.

In the above OLED display, the substrate includes first and second sides opposing each other, wherein the OLEDs are provided over the first side, and wherein the shield layer is provided over the second side.

The above OLED display further comprises a strengthened substrate provided over the second side of the substrate, wherein the shield layer is provided between the substrate and the strengthened substrate.

In the above OLED display, the substrate further includes a chamfered portion adjacent to an end of the strengthened substrate, wherein the end of the strengthened substrate and a portion of the connection line do not overlap the substrate in the area adjacent to the chamfered portion in the depth dimension of the OLED display.

In the above OLED display, the shield layer is provided between the substrate and the active patterns.

In the above OLED display, the shield layer comprises a plurality of shield lines at least two of which have different widths.

In the above OLED display, the shield layer is configured to receive power.

In the above OLED display, the transistors include a first transistor including i) a first active pattern including a first channel provided over the substrate and ii) a first gate electrode provided over the first active pattern, wherein the shield layer overlaps the first channel of the first active pattern in the depth dimension of the OLED display.

The above OLED display further comprises a capacitor electrode overlapping the first gate electrode in the depth dimension of the OLED display, wherein the capacitor electrode and the first gate electrode form a capacitor together, and wherein the shield layer overlaps the capacitor electrode in the depth dimension of the OLED display.

In the above OLED display, the transistors further include: a second transistor including a second active pattern electrically connected to the first active pattern and a second gate electrode provided over the second active pattern; and a third transistor including i) a third active pattern including a third channel configured to electrically connect the first active pattern and the first gate electrode and ii) a third gate electrode provided over the third active pattern, wherein the shield layer overlaps the third channel of the third active pattern in the depth dimension of the OLED display.

In the above OLED display, the shield layer does not overlap the second active pattern in the depth dimension of the OLED display.

The above OLED display further comprises: a first scan line provided over the second active pattern, overlapping the second and third active patterns in the depth dimension of the OLED display, and electrically connected to the second and third gate electrodes; a data line provided over the first scan line, crossing the first scan line, and electrically connected to the second active pattern; and a driving power supply line provided over the first scan line and spaced apart from the data line, wherein the driving power supply line crosses the first scan line and is electrically connected to the first active pattern.

In the above OLED display, the transistors further include a fourth transistor including i) a fourth active pattern electrically connected to the first gate electrode and the third active pattern and ii) a fourth gate electrode provided over the fourth active pattern, wherein the OLED display further includes: a second scan line provided over the fourth active pattern, overlapping the fourth active pattern in the depth dimension of the OLED display, and electrically connected to the fourth gate electrode; and an initialization power supply line provided over the second scan line and electrically connected to the fourth active pattern.

In the above OLED display, the transistors further include a seventh transistor including i) a seventh active pattern electrically connected to the fourth active pattern and ii) a seventh gate electrode provided over the seventh active pattern, wherein the OLED display further includes a third scan line provided over the seventh active pattern, overlapping the seventh active pattern in the depth dimension of the OLED display, and electrically connected to the seventh gate electrode.

In the above OLED display, the transistors further include: a fifth transistor including i) a fifth active pattern configured to electrically connect the first active pattern and the driving power supply line and ii) a fifth gate electrode provided over the fifth active pattern; and a sixth transistor including i) a sixth active pattern configured to electrically connect the first active pattern and the OLED and ii) a sixth gate electrode provided over the sixth active pattern, wherein the OLED display further includes an emission control line provided over the fifth active pattern and the sixth active pattern, traversing the fifth and sixth active patterns, and electrically connected to the fifth and sixth gate electrodes.

In the above OLED display, the shield layer does not overlap at least one of the second, fourth, fifth, sixth, and seventh active patterns in the depth dimension of the OLED display.

Another aspect is an OLED display comprising: a substrate; a plurality of OLEDs provided over the substrate; a plurality of transistors electrically connected to the OLEDs and including: a driving transistor including a first active pattern electrically connected to the OLEDs and a first gate electrode provided over the first active pattern; and a complementary transistor including a second active pattern configured to electrically connect the first active pattern and the first gate electrode; and a shield layer overlapping the pixel circuits and the first and second active patterns in the depth dimension of the OLED display.

In the above OLED display, the shield layer contacts the substrate.

In the above OLED display, the distance between shield layer and the substrate is less than the distance between the first and second active patterns and the substrate.

In the above OLED display, the substrate is interposed between the transistors and the shield layer.

According to at least one of the disclosed embodiments, the OLED display with an improved transistor characteristic of the thin film transistor connected to the OLED is provided.

DETAILED DESCRIPTION OF CERTAIN INVENTIVE EMBODIMENTS

Figure 1:
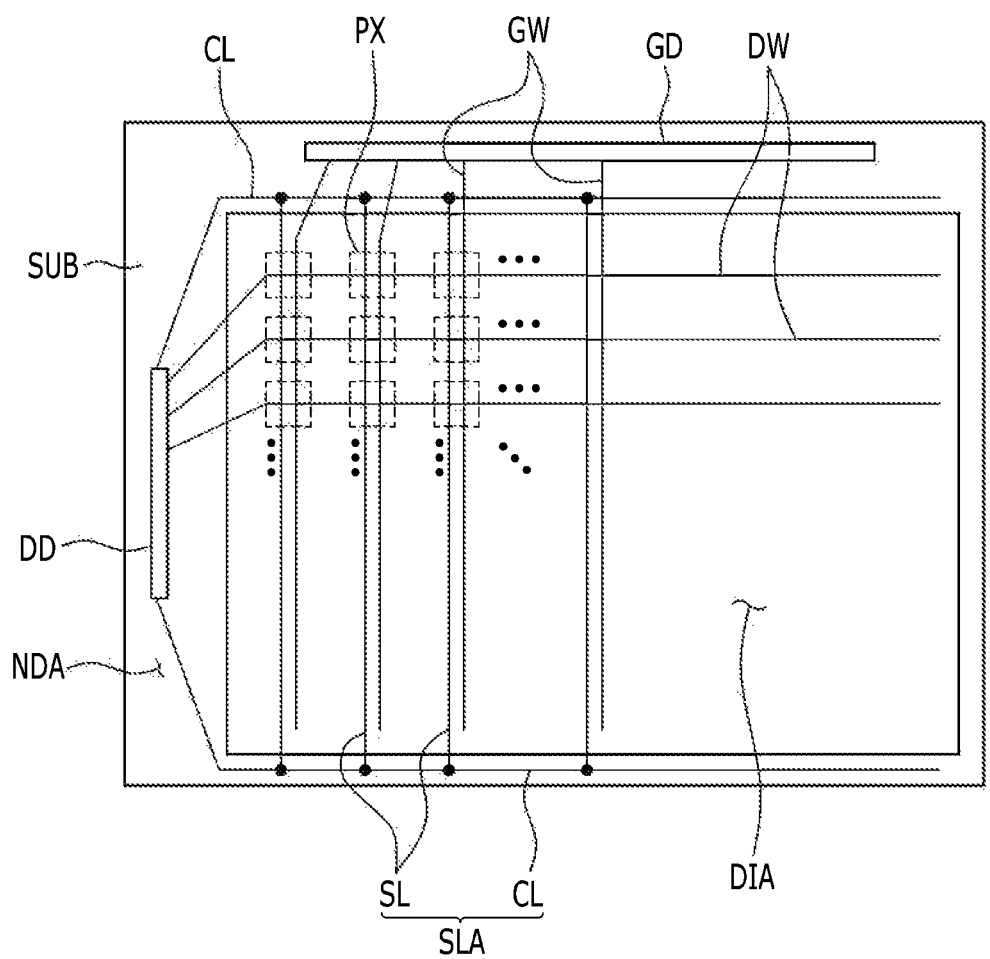
FIG. 1 shows a top plan view of an OLED display according to an exemplary embodiment.

In the following detailed description, only certain exemplary embodiments have been shown and described, simply by way of illustration. As those skilled in the art would realize, the described embodiments can be modified in various different ways, all without departing from the spirit or scope of the described technology.

Parts that are unrelated to the description of the exemplary embodiments are not shown to make the description clear, and like reference numerals designate like elements throughout the specification.

Furthermore, for exemplary embodiments, a detailed description is given for the constituent elements in the first exemplary embodiment with reference to the relevant drawings by using the same reference numerals for the same constituent elements, while only different constituent elements from those related to the first exemplary embodiment are described in other exemplary embodiments.

The size and thickness of each component illustrated in the drawings are arbitrarily illustrated in the drawings for better understanding and ease of description, but the described technology is not limited to the illustrations.

In the drawings, the thicknesses of layers, films, panels, regions, etc., are exaggerated for clarity. The thicknesses of the layers, films, panels, regions, etc., are enlarged in the drawings for better understanding and ease of description. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIG. 1 shows a top plan view of an OLED display according to an exemplary embodiment. A pixel can signify a minimum unit for displaying an image.

As shown in FIG. 1, the OLED display includes a substrate (SUB), a plurality of pixels (PX), a plurality of gate wires (GW), a gate driver (GD), a plurality of data wires (DW), a data driver (DD), and a shield layer (SLA).

The substrate (SUB) includes a display area (DIA) for displaying an image and a non-display area (NDA) neighboring the display area (DIA). The non-display area (NDA) can be provided to surround an edge of the display area (DIA), and without being restricted to this, the non-display area (NDA) can be provided to neighbor the display area (DIA). The substrate (SUB) is an insulating substrate formed of glass, polymer, or stainless steel. The substrate (SUB) can be flexible, stretchable, foldable, bendable, or rollable. Resultantly, the OLED display can be flexible, stretchable, foldable, bendable, or rollable.

The pixels (PX) are provided on the substrate (SUB) corresponding to the display area (DIA) of the substrate (SUB). The pixels (PX) are connected to the gate wires (GW) and the data wires (DW), respectively. The pixels (PX) respectively include a pixel circuit including an OLED for emitting light with luminance that corresponds to a driving current that corresponds to a signal supplied by the data wires (DW) switched by the gate wires (GW), a plurality of thin film transistors for controlling the driving current flowing to the OLED, and at least one capacitor. The pixels (PX) respectively include a pixel circuit including an OLED and the thin film transistors, so a plurality of pixel circuits including a plurality of OLEDs and the thin film transistors connected to the OLEDs are provided in the display area (DIA) of the substrate (SUB). The pixel circuits are provided between the substrate (SUB) and the OLED (OLED) in the pixels (PX).

The gate wires (GW) can be connected to the gate driver (GD) and can be connected to the pixels (PX), and they can respectively include a first scan line, a second scan line, a third scan line, an initialization power supply line, and an emission control line. The first scan line, the second scan line, the third scan line, the initialization power supply line, and the emission control line will be described in a later portion of the specification.

The gate wires (GW) including the first scan line, the second scan line, the third scan line, the initialization power supply line, and the emission control line may not be connected to the gate driver (GD) but can be connected to another driver through a pad of the substrate (SUB), and this connection can be performed in various forms that are known.

The gate driver (GD) is provided in the non-display area (NDA) of the substrate (SUB) and is connected to the gate wires (GW).

The data wires (DW) can be respectively connected to the data driver (DD) and can be connected to the pixels (PX), and they can include a data line and a driving power supply line. The data line and the driving power supply line will be described in a later portion of the specification.

The data wires (DW) including the data line and the driving power supply line may not be connected to the data driver (DD) and can be connected to another driver through the pad of the substrate (SUB), and this connection can be performed in various forms that are known.

The data driver (DD) is provided in the non-display area (NDA) of the substrate (SUB) and is connected to the data wires (DW).

The shield layer (SLA) is connected to the data driver (DD) and traverses the pixels (PX). The shield layer (SLA) includes a plurality of connection lines (CL) and a plurality of shield lines (SL). The shield layer (SLA) receives power from the data driver (DD) or another driver, and the power supplied to the shield layer (SLA) can be the same as that supplied to the driving power supply line included in the data wires (DW), and without being limited thereto, another level of power that is different from that supplied to the driving power supply line can be supplied.

The connection lines (CL) are provided in the non-display area (NDA) of the substrate (SUB), and are connected to the shield lines (SL) to connect between the shield lines (SL) and the data driver (DD).

The shield lines (SL) are separated from each other in a first direction, and are extended in a second direction crossing the first direction on the substrate (SUB). Here, the second direction can be parallel to a direction in which the gate wires (GW) are extended, but it is not restricted thereto.

The shield lines (SL) are connected to each other through the connection line (CL). The connection line (CL) is extended in a first direction and is connected to the shield lines (SL) in the non-display area (NDA).

The shield layer (SLA) may not be connected to the data driver (DD) and can be connected to another driver through a pad of the substrate (SUB).

Figure 2:
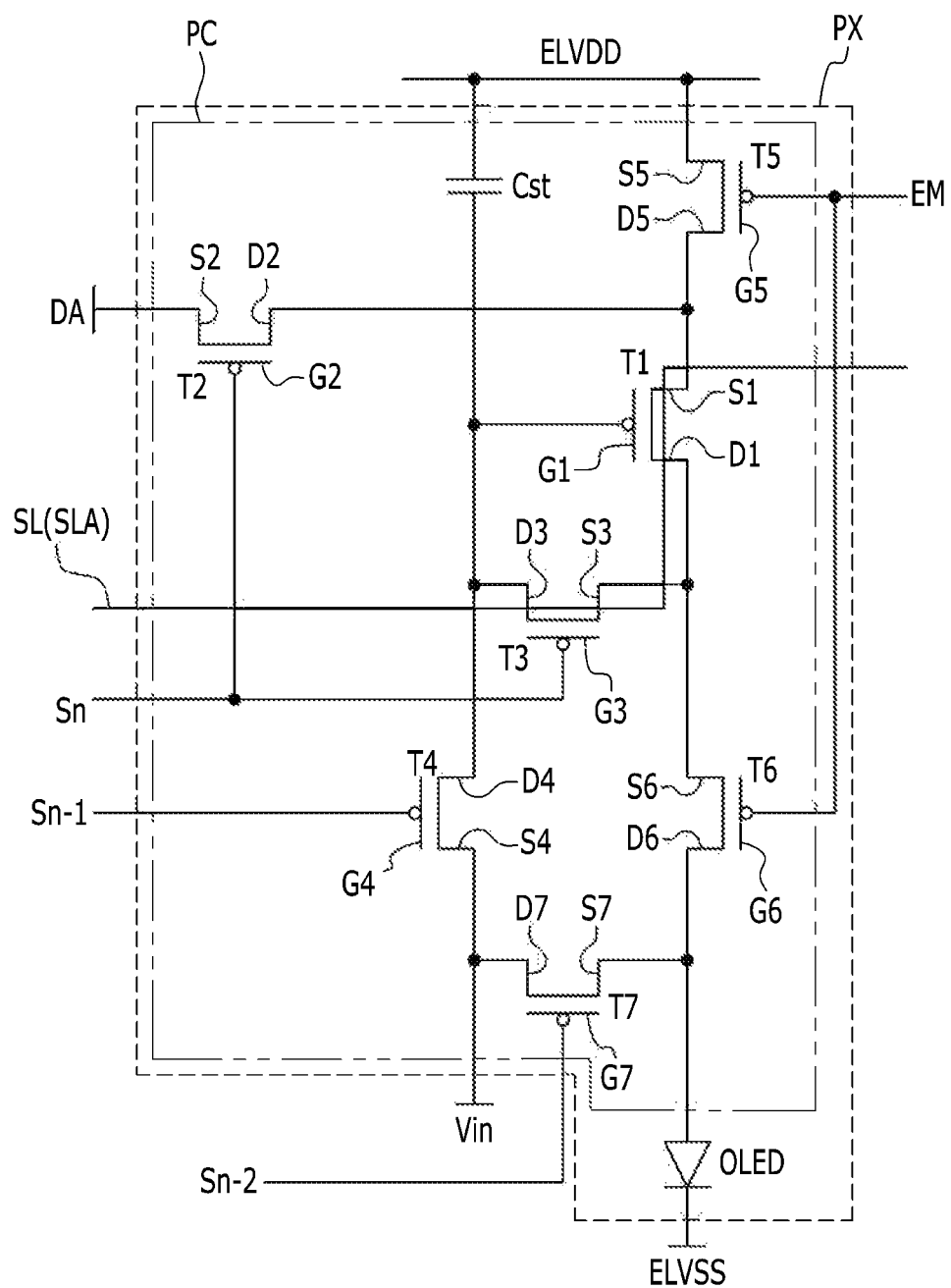
FIG. 2 shows a circuit diagram of a pixel of the OLED display shown in FIG. 1.

FIG. 2 shows a circuit diagram of a pixel of the OLED display shown in FIG. 1.

As shown in FIG. 2, the pixel PX of the OLED display includes a pixel circuit (PC) including a plurality of thin film transistors (T1, T2, T3, T4, T5, T6, and T7) selectively connected to a first scan line (Sn), a second scan line Sn−1, a third scan line Sn−2, an emission control line (EM), an initialization power supply line Vin, a data line (DA), and a driving power supply line (ELVDD) and a capacitor Cst, and an OLED connected to the pixel circuit (PC).

The shield line (SL) of the above-noted shield layer (SLA) passes through the thin film transistors T1 and T3 from among the thin film transistors (T1, T2, T3, T4, T5, T6, and T7) included in the pixel circuit (PC), and the shield line (SL) overlaps an active pattern of the thin film transistors T1 and T3.

Here, the first scan line (Sn), the second scan line Sn−1, the third scan line Sn−2, the emission control line (EM), and the initialization power supply line Vin can be included in the gate wires, and the data line (DA) and the driving power supply line (ELVDD) can be included in the data wires. The first scan line (Sn), the second scan line Sn−1, the third scan line Sn−2, the emission control line (EM), the initialization power supply line Vin, the data line (DA), and the driving power supply line (ELVDD) can include the same material or different materials, and can be provided on the same layer or different layers on the substrate (SUB).

The thin film transistors (T1, T2, T3, T4, T5, T6, and T7) include a first thin film transistor T1, a second thin film transistor T2, a third thin film transistor T3, a fourth thin film transistor T4, a fifth thin film transistor T5, a sixth thin film transistor T6, and a seventh thin film transistor T7.

The first thin film transistor T1 includes: a first gate electrode G1 connected to a third drain electrode D3 of the third thin film transistor T3, a fourth drain electrode D4 of the fourth thin film transistor T4, and a first electrode of the capacitor Cst; a first source electrode S1 connected to a second drain electrode D2 of the second thin film transistor T2 and a fifth drain electrode D5 of the fifth thin film transistor T5; and a first drain electrode D1 connected to a third source electrode S3 of the third thin film transistor T3 and a sixth source electrode S6 of the sixth thin film transistor T6. The shield line (SL) of the shield layer (SLA) passes through the first thin film transistor T1, and the shield line (SL) traverses the pixel circuit (PC) and overlaps the active pattern of the first thin film transistor T1.

The second thin film transistor T2 includes a second gate electrode G2 connected to the first scan line (Sn), a second source electrode S2 connected to the data line (DA), and a second drain electrode D2 connected to the first source electrode S1 of the first thin film transistor T1.

The third thin film transistor T3 includes a third gate electrode G3 connected to the first scan line (Sn), a third source electrode S3 connected to the first drain electrode D1 of the first thin film transistor T1, and a third drain electrode D3 connected to the first gate electrode G1 of the first thin film transistor T1. The shield line (SL) of the shield layer (SLA) passes through the third thin film transistor T3, and the shield line (SL) traverses the pixel circuit (PC) and overlaps the active pattern of the third thin film transistor T3.

The fourth thin film transistor T4 includes a fourth gate electrode G4 connected to the second scan line Sn−1, a fourth source electrode S4 connected to the initialization power supply line Vin, and a fourth drain electrode D4 connected to the first gate electrode G1 of the first thin film transistor T1.

The fifth thin film transistor T5 includes a fifth gate electrode G5 connected to the emission control line (EM), a fifth source electrode S5 connected to the driving power supply line (ELVDD), and a fifth drain electrode D5 connected to the first source electrode S1 of the first thin film transistor T1.

The sixth thin film transistor T6 includes a sixth gate electrode G6 connected to the emission control line (EM), a sixth source electrode S6 connected to the first drain electrode D1 of the first thin film transistor T1, and a sixth drain electrode D6 connected to the OLED. The first thin film transistor T1 is connected to the OLED through the sixth thin film transistor T6.

The seventh thin film transistor T7 includes a seventh gate electrode G7 connected to the third scan line Sn−2, a seventh source electrode S7 connected to the OLED, and a seventh drain electrode D7 connected to the fourth source electrode S4 of the fourth thin film transistor T4.

The capacitor Cst includes a second electrode connected to the driving power supply line (ELVDD), and a first electrode connected to the first gate electrode G1 and the third drain electrode D3 of the third thin film transistor T3.

The OLED includes a first electrode, a second electrode provided on the first electrode, and an organic emission layer provided between the first electrode and the second electrode. The first electrode of the OLED is connected to the seventh source electrode S7 of the seventh thin film transistor T7 and the sixth drain electrode D6 of the sixth thin film transistor T6, and the second electrode is connected to a common power source (ELVSS) for supplying a common signal.

A disposal of a pixel of the OLED display will now be described with reference to FIG. 3 and FIG. 4.

Insulating layers are provided between constituent elements provided on different layers, and they can be inorganic insulating layers or organic insulating layers such as a silicon nitride or a silicon oxide. The insulating layers can be provided to be a single layer or multiple layers.

Figure 3:
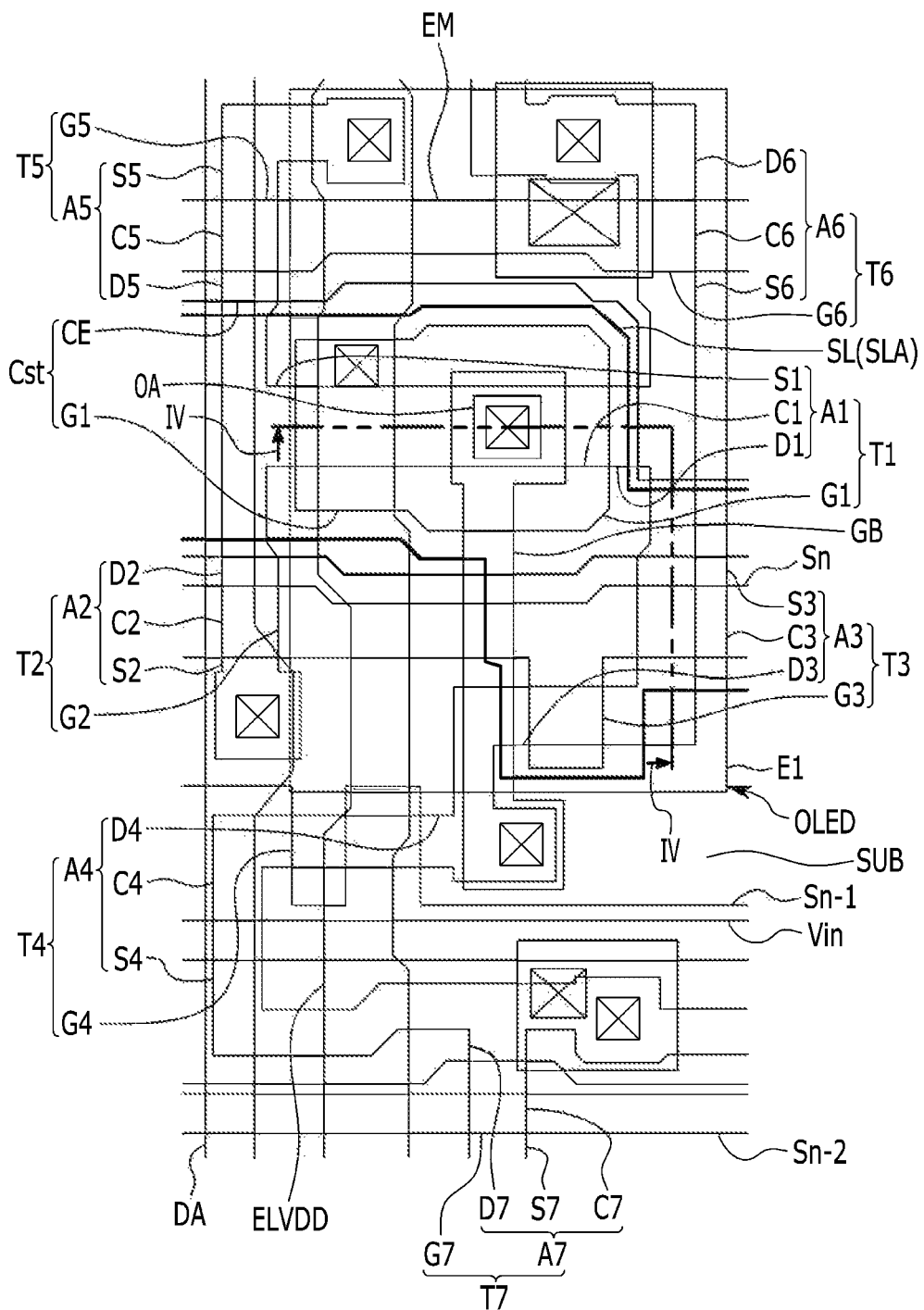
FIG. 3 shows a layout view of a pixel of the OLED display shown in FIG. 1.

FIG. 3 shows a layout view of a pixel of the OLED display shown in FIG. 1. FIG. 4 shows a cross-sectional view with respect to a line IV-IV of FIG. 3.

Figure 4:
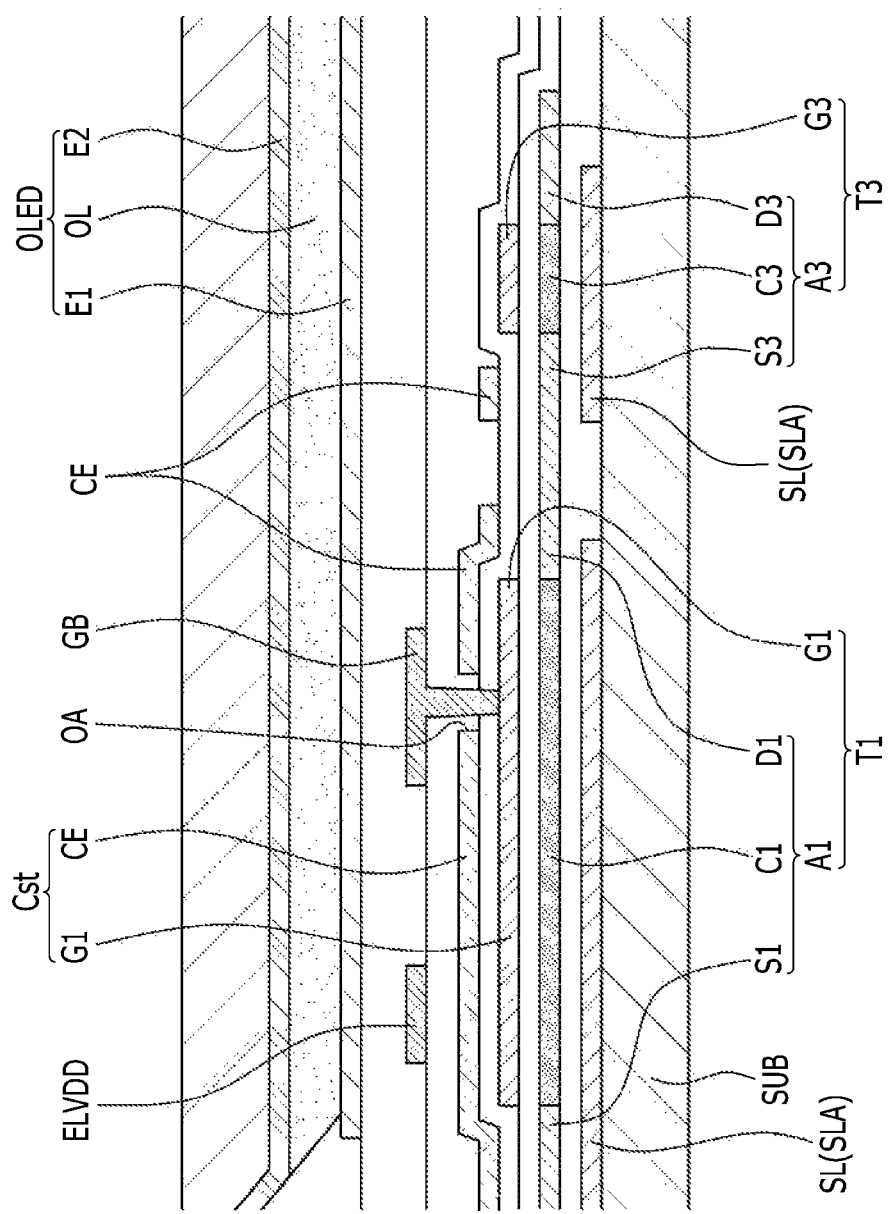
FIG. 4 shows a cross-sectional view with respect to a line IV-IV of FIG. 3.

As shown in FIG. 3 and FIG. 4, the pixel includes a pixel circuit including a first thin film transistor T1, a second thin film transistor T2, a third thin film transistor T3, a fourth thin film transistor T4, a fifth thin film transistor T5, a sixth thin film transistor T6, a seventh thin film transistor T7, a capacitor Cst, and a gate bridge (GB) selectively connected to a first scan line (Sn), a second scan line Sn−1, a third scan line Sn−2, an emission control line (EM), a data line (DA), a driving power supply line (ELVDD), and an initialization power supply line Vin, and an OLED connected to the pixel circuit. A shield line (SL) of a shield layer (SLA) traverses the pixel circuit and overlaps a first active pattern A1 of the first thin film transistor T1 and a third active pattern A3 of the third thin film transistor T3.

The first thin film transistor T1 is provided on the substrate (SUB), and includes a first active pattern A1 and a first gate electrode G1.

The first active pattern A1 includes a first source electrode S1, a first channel C1, and a first drain electrode D1. The first source electrode S1 is connected to a second drain electrode D2 of the second thin film transistor T2 and a fifth drain electrode D5 of the fifth thin film transistor T5, and the first drain electrode D1 is connected to a third source electrode S3 of the third thin film transistor T3 and a sixth source electrode S6 of the sixth thin film transistor T6.

The first active pattern A1 can be formed of a polysilicon or an oxide semiconductor. The oxide semiconductor can include an oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (In—Ga—Zn—O), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). When the first active pattern A1 is formed of the oxide semiconductor, a passivation layer can be added in order to protect the oxide semiconductor that is vulnerable to an external environment such as a high temperature or the like.

The first channel C1 of the first active pattern A1 can be channel-region-doped with an N-type impurity or a P-type impurity, and the first source electrode S1 and the first drain electrode D1 can be spaced apart from each other with the first channel C1 interposed therebetween and can be doped with an opposite type of impurity to that with which the first channel C1 is doped.

The first gate electrode G1 is provided on the first channel C1 of the first active pattern A1 and has an island shape. The first gate electrode G1 is connected to a fourth drain electrode D4 of the fourth thin film transistor T4 and a third drain electrode D3 of the third thin film transistor T3 by the gate bridge (GB) passing through a contact hole. The first gate electrode G1 overlaps a capacitor electrode (CE), it can function as a gate electrode of the first thin film transistor T1, and it can also function as an electrode of the capacitor Cst. That is, the first gate electrode G1 configures the capacitor Cst together with the capacitor electrode (CE).

A shield line (SL) of the shield layer (SLA) is provided between the first active pattern A1 and the substrate (SUB).

The first channel C1 of the first active pattern A1 overlaps the shield line (SL), and power is supplied to the shield line (SL) such that charges such as electrons or holes are stored at the first channel C1 of the first active pattern A1 depending on a polarity of the power supplied to the shield line (SL), thereby controlling a threshold voltage of the first thin film transistor T1.

That is, the threshold voltage of the first thin film transistor T1 can be increased or decreased by use of the shield line (SL), and hysteresis that can occur at the first thin film transistor T1 can be improved by controlling the threshold voltage of the first thin film transistor T1.

The second thin film transistor T2 is provided on the substrate (SUB), and includes a second active pattern A2 and a second gate electrode G2. The second active pattern A2 includes a second source electrode S2, a second channel C2, and a second drain electrode D2. The second source electrode S2 is connected to the data line (DA) through a contact hole, and the second drain electrode D2 is connected to the first source electrode S1 of the first thin film transistor T1. The second channel C2 that is a channel region of the second active pattern A2 overlapping the second gate electrode G2 is provided between the second source electrode S2 and the second drain electrode D2. That is, the second active pattern A2 is connected to the first active pattern A1.

The second channel C2 of the second active pattern A2 can be a channel doped with an N-type impurity or a P-type impurity, and the second source electrode S2 and the second drain electrode D2 can be spaced apart from each other with the first channel C1 therebetween and can be doped with an opposite type of impurity to that with which the first channel C1 is doped. The second active pattern A2 is provided on the same layer as the first active pattern A1, it is formed of the same material as the first active pattern A1, and it is integrally formed with the first active pattern A1.

The second gate electrode G2 is provided on the second channel C2 of the second active pattern A2, and is integrally formed with the first scan line (Sn).

The shield line (SL) of the shield layer (SLA) is not provided between the second active pattern A2 and the substrate (SUB), and the second channel C2 of the second active pattern A2 does not overlap the shield line (SL).

The third thin film transistor T3 is provided on the substrate (SUB), and includes a third active pattern A3 and a third gate electrode G3.

The third active pattern A3 includes a third source electrode S3, a third channel C3, and a third drain electrode D3. The third source electrode S3 is connected to the first drain electrode D1, and the third drain electrode D3 is connected to the first gate electrode G1 of the first thin film transistor T1 by the gate bridge (GB) passing through the contact hole. The third channel C3 that is a channel region of the third active pattern A3 overlapping the third gate electrode G3 is provided between the third source electrode S3 and the third drain electrode D3. That is, the third active pattern A3 connects between the first active pattern A1 and the first gate electrode G1.

The third channel C3 of the third active pattern A3 can be a channel doped with an N-type impurity or a P-type impurity, and the third source electrode S3 and the third drain electrode D3 can be spaced apart from each other with the third channel C3 therebetween and can be doped with an opposite type of impurity to that with which the third channel C3 is doped. The third active pattern A3 is provided on the same layer as, formed of the same material as, and integrally formed with the first and second active patterns A1 and A2.

The third gate electrode G3 is provided on the third channel C3 of the third active pattern A3, and is integrally formed with the first scan line (Sn). The third gate electrode G3 is formed as a dual-gate electrode.

The shield line (SL) of the shield layer (SLA) is provided between the third active pattern A3 and the substrate (SUB). The third channel C3 of the third active pattern A3 overlaps the shield line (SL), and power is supplied to the shield line (SL) such that charges such as electrons or holes are stored at the third channel C3 of the third active pattern A3 depending on a polarity of the power supplied to the shield line (SL), thereby controlling a threshold voltage of the third thin film transistor T3.

That is, the threshold voltage of the third thin film transistor T3 can be increased or decreased by use of the shield line (SL), and hysteresis that can occur at the third thin film transistor T3 can be improved by controlling the threshold voltage of the third thin film transistor T3.

The fourth thin film transistor T4 is provided on the substrate (SUB), and includes a fourth active pattern A4 and a fourth gate electrode G4.

The fourth active pattern A4 includes a fourth source electrode S4, a fourth channel C4, and a fourth drain electrode D4. The fourth source electrode S4 is connected to the initialization power supply line Vin through the contact hole, and the fourth drain electrode D4 is connected to the first gate electrode G1 of the first thin film transistor T1 through the gate bridge (GB) passing through the contact hole. The fourth channel C4 that is a channel region of the fourth active pattern A4 overlapping the fourth gate electrode G4 is provided between the fourth source electrode S4 and the fourth drain electrode D4. That is, the fourth active pattern A4 connects between the initialization power supply line Vin and the first gate electrode G1, and is connected to the third active pattern A3 and the first gate electrode G1.

The fourth channel C4 of the fourth active pattern A4 can be a channel doped with an N-type impurity or a P-type impurity, and the fourth source electrode S4 and the fourth drain electrode D4 can be spaced apart from each other with the fourth channel C4 therebetween and can be doped with an opposite type of impurity to that with which the fourth channel C4 is doped. The fourth active pattern A4 is provided on the same layer as, formed of the same material as, and integrally formed with the first, second, and third active patterns A1, A2, and A3.

The fourth gate electrode G4 is provided on the fourth channel C4 of the fourth active pattern A4 and is integrally formed with the second scan line Sn−1. The fourth gate electrode G4 is formed to be a dual-gate electrode.

The shield line (SL) of the shield layer (SLA) is not provided between the fourth active pattern A4 and the substrate (SUB), and the fourth channel C4 of the fourth active pattern A4 does not overlap the shield line (SL).

The fifth thin film transistor T5 is provided on the substrate (SUB), and includes a fifth active pattern A5 and a fifth gate electrode G5.

The fifth active pattern A5 includes a fifth source electrode S5, a fifth channel C5, and a fifth drain electrode D5. The fifth source electrode S5 is connected to the driving power supply line (ELVDD) through the contact hole, and the fifth drain electrode D5 is connected to the first source electrode S1 of the first thin film transistor T1. The fifth channel C5 that is a channel region of the fifth active pattern A5 overlapping the fifth gate electrode G5 is provided between the fifth source electrode S5 and the fifth drain electrode D5. That is, the fifth active pattern A5 connects between the driving power supply line (ELVDD) and the first active pattern A1.

The fifth channel C5 of the fifth active pattern A5 can be a channel doped with an N-type impurity or a P-type impurity, and fifth source electrode S5 and the fifth drain electrode D5 can be spaced apart from each other with the fifth channel C5 therebetween and can be doped with an opposite type of impurity to that with which the fifth channel C5 is doped. The fifth active pattern A5 is provided on the same layer as, formed of the same material as, and integrally formed with the first to fourth active patterns A1, A2, A3, and A4.

The fifth gate electrode G5 is provided on the fifth channel C5 of the fifth active pattern A5, and is integrally formed with the emission control line (EM).

The shield line (SL) of the shield layer (SLA) is not provided between the fifth active pattern A5 and the substrate (SUB), and the fifth channel C5 of the fifth active pattern A5 does not overlap the shield line (SL).

The sixth thin film transistor T6 is provided on the substrate (SUB), and includes a sixth active pattern A6 and a sixth gate electrode G6.

The sixth active pattern A6 includes a sixth source electrode S6, a sixth channel C6, and a sixth drain electrode D6. The sixth source electrode S6 is connected to the first drain electrode D1 of the first thin film transistor T1, and the sixth drain electrode D6 is connected to a first electrode E1 of the OLED through a contact hole. The sixth channel C6 that is a channel region of the sixth active pattern A6 overlapping the sixth gate electrode G6 is provided between the sixth source electrode S6 and the sixth drain electrode D6. That is, the sixth active pattern A6 connects between the first active pattern A1 and the first electrode E1 of the OLED.

The sixth channel C6 of the sixth active pattern A6 can be a channel doped with an N-type impurity or a P-type impurity, and the sixth source electrode S6 and the sixth drain electrode D6 can be spaced apart from each other with the sixth channel C6 therebetween and can be doped with an opposite type of impurity to that with which the sixth channel C6 is doped. The sixth active pattern A6 is provided on the same layer as, formed of the same material as, and integrally formed with the first to fifth active patterns A1, A2, A3, A4, and A5.

The sixth gate electrode G6 is provided on the sixth channel C6 of the sixth active pattern A6, and is integrally formed with the emission control line (EM).

The shield line (SL) of the shield layer (SLA) is not provided between the sixth active pattern A6 and the substrate (SUB), and the sixth channel C6 of the sixth active pattern A6 does not overlap the shield line (SL).

The seventh thin film transistor T7 is provided on the substrate (SUB), and includes a seventh active pattern A7 and a seventh gate electrode G7.

The seventh active pattern A7 includes a seventh source electrode S7, a seventh channel C7, and a seventh drain electrode D7. The seventh source electrode S7 is connected to a first electrode of an OLED of another pixel (that can be another pixel provided on a bottom portion of the pixel shown in FIG. 3) that is not shown in FIG. 3, and the seventh drain electrode D7 is connected to the fourth source electrode S4 of the fourth thin film transistor T4. The seventh channel C7 that is a channel region of the seventh active pattern A7 overlapping the seventh gate electrode G7 is provided between the seventh source electrode S7 and the seventh drain electrode D7. That is, the seventh active pattern A7 connects between the first electrode of the OLED and the fourth active pattern A4.

The seventh channel C7 of the seventh active pattern A7 can be a channel doped with an N-type impurity or a P-type impurity, and the seventh source electrode S7 and the seventh drain electrode D7 can be spaced apart from each other with the seventh channel C7 therebetween and can be doped with an opposite type of impurity to that with which the seventh channel C7 is doped. The seventh active pattern A7 is provided on the same layer as, formed of the same material as, and integrally formed with the first to sixth active patterns A1, A2, A3, A4, A5, and A6.

The seventh gate electrode G7 is provided on a seventh channel C7 of the seventh active pattern A7, and is integrally formed with the third scan line Sn−2.

The shield line (SL) of the shield layer (SLA) is not provided between the seventh active pattern A7 and the substrate (SUB), and the seventh channel C7 of the seventh active pattern A7 does not overlap the shield line (SL).

The first scan line (Sn) is provided on the second active pattern A2 and the third active pattern A3 to be extended in a direction traversing the second active pattern A2 and the third active pattern A3. The first scan line (Sn) is integrally formed with the second gate electrode G2 and the third gate electrode G3 to be connected to the second gate electrode G2 and the third gate electrode G3.

The second scan line Sn−1 is separated from the first scan line (Sn) to be provided on the fourth active pattern A4, it is extended in a direction traversing the fourth active pattern A4, and it is integrally formed with the fourth gate electrode G4 to be connected to the fourth gate electrode G4.

The third scan line Sn−2 is separated from the second scan line Sn−1 to be provided on the seventh active pattern A7, it is extended in a direction traversing the seventh active pattern A7, and it is integrally formed with the seventh gate electrode G7 to be connected to the seventh gate electrode G7.

The emission control line (EM) is separated from the first scan line (Sn) to be provided on the fifth active pattern A5 and the sixth active pattern A6, it is extended in a direction traversing the fifth active pattern A5 and the sixth active pattern A6, and it is integrally formed with the fifth gate electrode G5 and the sixth gate electrode G6 to be connected to the fifth gate electrode G5 and the sixth gate electrode G6.

The above-described emission control line (EM), the third scan line Sn−2, the second scan line Sn−1, the first scan line (Sn), the first gate electrode G1, the second gate electrode G2, the third gate electrode G3, the fourth gate electrode G4, the fifth gate electrode G5, the sixth gate electrode G6, and the seventh gate electrode G7 are provided on the same layer and are formed of the same material. In another exemplary embodiment, the emission control line (EM), the third scan line Sn−2, the second scan line Sn−1, the first scan line (Sn), the first gate electrode G1, the second gate electrode G2, the third gate electrode G3, the fourth gate electrode G4, the fifth gate electrode G5, the sixth gate electrode G6, and the seventh gate electrode G7 can be selectively provided on different layers and can be formed of different materials.

The capacitor Cst includes a first electrode and a second electrode facing each other with an insulating layer therebetween. The first electrode can be a capacitor electrode (CE) and the second electrode can be a first gate electrode G1. The capacitor electrode (CE) is provided on the first gate electrode G1, and is connected to a driving power supply line (ELVDD) through a contact hole.

The capacitor electrode (CE) configures the capacitor Cst together with the first gate electrode G1, and the first gate electrode G1 and the capacitor electrode (CE) can be formed of different metals or the same metal on different layers.

The capacitor electrode (CE) includes an opening (OA) overlapping part of the first gate electrode G1, and the gate bridge (GB) is connected to the first gate electrode G1 through the opening (OA). The capacitor electrode (CE) overlaps the shield line (SL) of the shield layer (SLA).

The data line (DA) is provided on the first scan line (Sn) to be extended in a direction traversing the first scan line (Sn), and it is connected to the second source electrode S2 of the second active pattern A2 through the contact hole. The data line (DA) is extended to traverse the first scan line (Sn), the second scan line Sn−1, the third scan line Sn−2, and the emission control line (EM).

The driving power supply line (ELVDD) is separated from the data line (DA) to be provided on the first scan line (Sn), it is extended in a second direction traversing the first scan line (Sn), and it is connected to the fifth source electrode S5 of the fifth active pattern A5 connected to the capacitor electrode (CE) and the first active pattern A1 through the contact hole. The driving power supply line (ELVDD) is extended to traverse the first scan line (Sn), the second scan line Sn−1, the third scan line Sn−2, and the emission control line (EM).

The gate bridge (GB) is provided on the first scan line (Sn) to be spaced from the driving power supply line (ELVDD), and it is connected to the third drain electrode D3 of the third active pattern A3 and the fourth drain electrode D4 of the fourth active pattern A4 through the contact hole to be connected to the first gate electrode G1 exposed by the opening (OA) of the capacitor electrode (CE) through the contact hole.

The above-described data line (DA), the driving power supply line (ELVDD), and the gate bridge (GB) are provided on the same layer and are formed of the same material. In another exemplary embodiment, the data line (DA), the driving power supply line (ELVDD), and the gate bridge (GB) can be selectively provided on different layers and can be formed of different materials.

The initialization power supply line Vin is provided on the second scan line Sn−1, and it is connected to the fourth source electrode S4 of the fourth active pattern A4 through the contact hole. The initialization power supply line Vin is provided on the same layer as the first electrode E1 of the OLED, and is formed of the same material. In another exemplary embodiment, the initialization power supply line Vin can be provided on a different layer from the first electrode E1, and can be formed of a different material.

The OLED includes a first electrode E1, an organic emission layer OL, and a second electrode E2. The first electrode E1 is connected to the sixth drain electrode D6 of the sixth thin film transistor T6 through the contact hole. The organic emission layer OL is provided between the first electrode E1 and the second electrode E2. The second electrode E2 is provided on the organic emission layer OL. At least one of the first electrode E1 and the second electrode E2 can be at least one of a light transmittable electrode, a light reflective electrode, and a light semi-transmittable electrode, and the light emitted from the organic emission layer OL can be output in at least one electrode direction of the first electrode E1 and the second electrode E2.

A capping layer for covering the OLED can be provided on the OLED, and a thin film encapsulation layer or an encapsulation substrate can be provided on the OLED with the capping layer therebetween.

The shield line (SL) of the shield layer (SLA) is provided between the first active pattern A1 of the first thin film transistor T1 and the substrate (SUB), and between the third active pattern A3 of the third thin film transistor T3 and the substrate (SUB).

The shield line (SL) overlaps the first channel C1 of the first active pattern A1 and the third channel C3 of the third active pattern A3. Power is supplied to the shield layer (SLA), and hence, power is supplied to the shield line (SL).

The shield layer (SLA) includes a metal, and without being limited thereto, it can include another kind of material for supplying power such as a conductive polymer.

The shield line (SL) of the shield layer (SLA) to which the power is supplied overlaps the first active pattern A1 of the first thin film transistor T1 and the third active pattern A3 of the third thin film transistor T3 such that the OLED display can control threshold voltages of the first and second thin film transistors T1 and T3, thereby improving transistor characteristics of the first and third thin film transistors T1 and T3. Therefore, the light emission efficiency of the OLED connected to the first thin film transistor T1 is improved.

For example, the first thin film transistor T1 is a driving thin film transistor connected to the OLED and the third thin film transistor T3 is a complementary thin film transistor for connecting between the first drain electrode D1 and the first gate electrode G1. The first and third thin film transistors T1 and T3 are thin film transistors that impart an actual influence to a current supplied to the OLED. The first channel C1 and the third channel C3 overlap the shield line (SL) of the shield layer (SLA), power is supplied to the shield line (SL), and charges such as electrons or holes are resultantly supplied to the first channel C1 and the third channel C3 according to the polarity of the power supplied to the shield line (SL), thereby controlling the threshold voltages of the first and third thin film transistors T1 and T3.

That is, the threshold voltages of the first and third thin film transistors T1 and T3 can be increased or reduced by using the shield line (SL), and the hysteresis that can occur at the first and third thin film transistors T1 and T3 can be improved by controlling the threshold voltages of the first and third thin film transistors T1 and T3, thereby improving the light emission efficiency of the OLED connected to the first thin film transistor T1.

The transistor characteristics of the first thin film transistor T1 that is a driving thin film transistor and the third thin film transistor T3 that is a complementary thin film transistor are improved by using the shield line (SL) such that the OLED display with improved emission efficiency of the OLED is provided.

Figure 5:
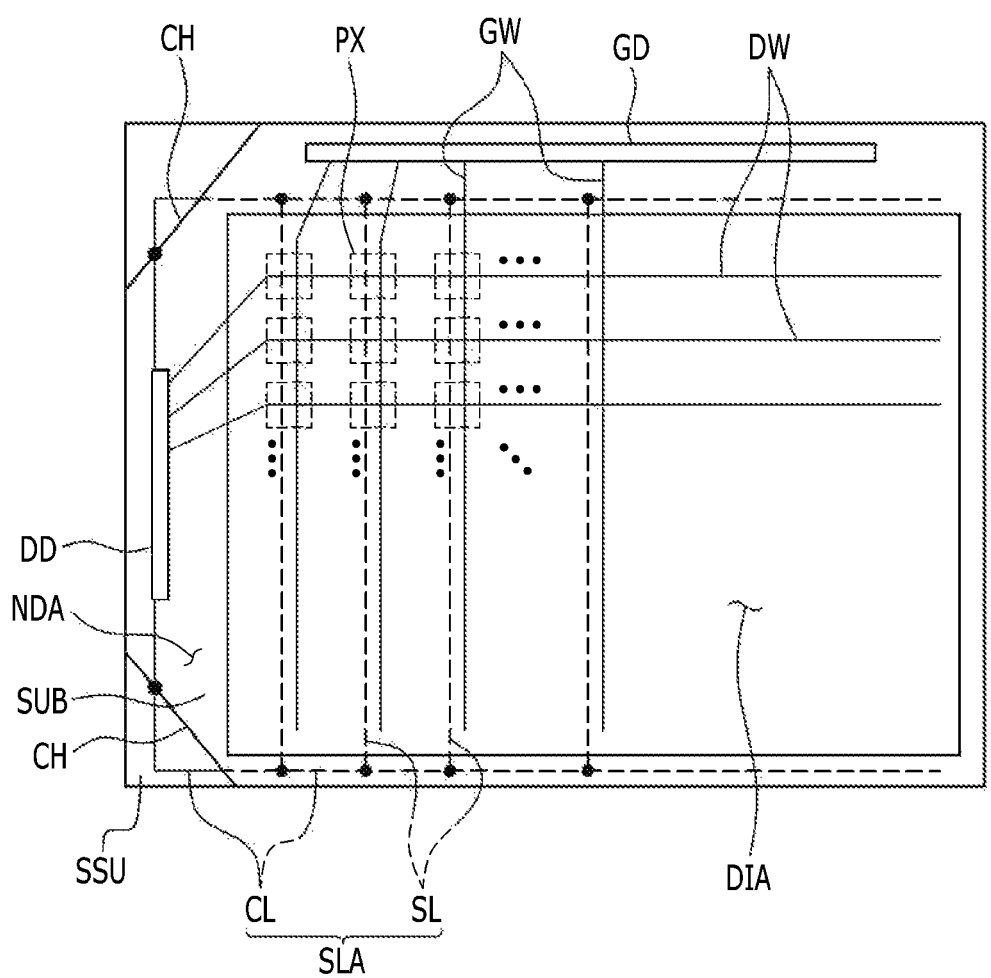
FIG. 5 shows a top plan view of an OLED display according to another exemplary embodiment.

FIG. 5 shows a top plan view of an OLED display according to another exemplary embodiment. Portions that are different from the OLED display will now be described.

As shown in FIG. 5, the OLED display includes a substrate (SUB), a plurality of pixels (PX), the gate wires (GW), a gate driver (GD), a plurality of data wires (DW), a data driver (DD), a shield layer (SLA), and a strengthened substrate (SSU).

The substrate (SUB) includes a display area (DIA) for displaying an image and a non-display area (NDA) neighboring the display area (DIA). The substrate (SUB) can be provided on the strengthened substrate (SSU), and the substrate (SUB) can be attached to the strengthened substrate (SSU).

The substrate (SUB) further includes a chamfered unit (or chamfered portion) (CH) neighboring the data driver (DD), and the chamfered unit (CH) exposes a corner that is an end of the strengthened substrate (SSU).

The strengthened substrate (SSU) is provided on a rear side of the substrate (SUB), and the corner that is an end of the strengthened substrate (SSU) is exposed by the chamfered unit (CH) of the substrate (SUB). The strengthened substrate (SSU) can be attached to the rear side of the substrate (SUB), but it is not limited thereto. The strengthened substrate (SSU) can be formed of a material that is different from the substrate (SUB), and without being restricted to this, it can be formed of the same material as the substrate (SUB).

The shield layer (SLA) is provided on the rear side of the substrate (SUB), and is provided between the substrate (SUB) and the strengthened substrate (SSU).

The shield layer (SLA) includes a connection line CL and a plurality of shield lines (SL), and a cross-section of the connection line CL is exposed by the chamfered unit (CH) of the substrate (SUB).

The connection line CL exposed by the chamfered unit (CH) of the substrate (SUB) is connected to the data driver (DD) provided on the substrate (SUB) through the chamfered unit (CH). The connection line CL is extended in a direction between the substrate (SUB) and the strengthened substrate (SSU) to be connected to the shield lines (SL) provided between the substrate (SUB) and the strengthened substrate (SSU).

The shield lines (SL) are separated from each other in a first direction, and are extended in a second direction crossing the first direction on the rear side of the substrate (SUB). The second direction can be a direction parallel to the direction in which the gate wires (GW) are extended, and this is not restrictive.

In another exemplary embodiment, the shield layer (SLA) can be connected to the data driver (DD) of the substrate (SUB) through the contact hole formed in the substrate (SUB).

Figure 6:
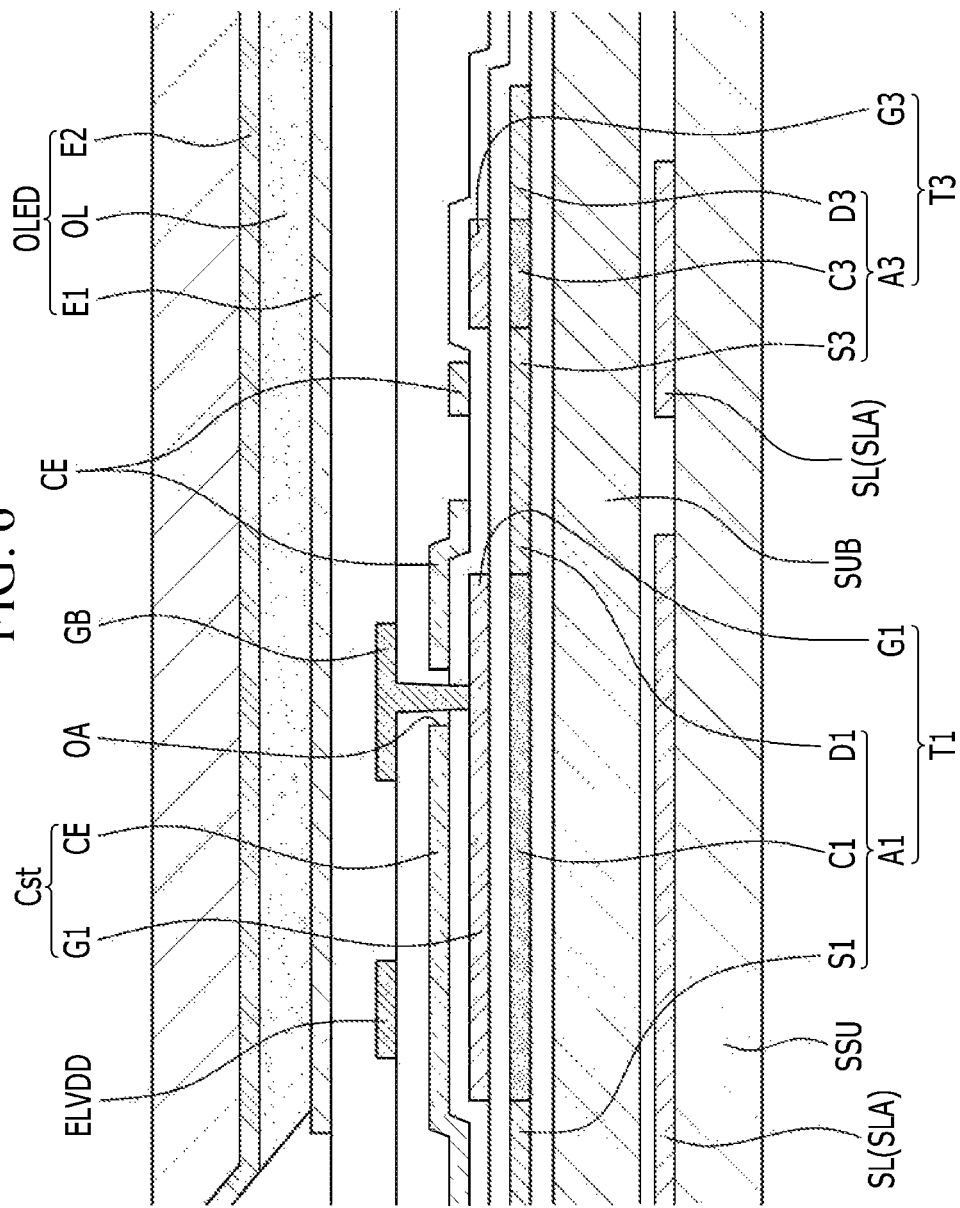
FIG. 6 shows a cross-sectional view of an OLED display according to another exemplary embodiment.

FIG. 6 shows a cross-sectional view of the OLED display 200.

As shown in FIG. 6, the shield line (SL) of the shield layer (SLA) is provided between the substrate (SUB) and the strengthened substrate (SSU) corresponding to the first active pattern A1 of the first thin film transistor T1, and is provided between the substrate (SUB) and the strengthened substrate (SSU) corresponding to the third active pattern A3 of the third thin film transistor T3.

The shield line (SL) overlaps the first channel C1 of the first active pattern A1 and the third channel C3 of the third active pattern A3. Power is supplied to the shield layer (SLA), and by this, power is also supplied to the shield line (SL).

As described, the shield line (SL) of the shield layer (SLA) to which power is supplied overlaps the first active pattern A1 of the first thin film transistor T1 and the third active pattern A3 of the third thin film transistor T3 such that the OLED display can control the threshold voltages of the first and third thin film transistors T1 and T3, thereby improving the transistor characteristics of the first and third thin film transistors T1 and T3. Therefore, the light emission efficiency of the OLED connected to the first thin film transistor T1 is improved.

For example, the first thin film transistor T1 is a driving thin film transistor connected to the OLED and the third thin film transistor T3 is a complementary thin film transistor for connecting between the first drain electrode D1 of the first thin film transistor T1 and the first gate electrode G1. The first and third thin film transistors T1 and T3 are thin film transistors that substantially influence the current supplied to the OLED. The first channel C1 of the first active pattern A1 of the first thin film transistor T1 and the third channel C3 of the third active pattern A3 of the third thin film transistor T3 respectively overlap the shield line (SL) of the shield layer (SLA) and power is supplied to the shield line (SL), and the charges such as electrons or holes are stored to the first channel C1 of the first active pattern A1 and the third channel C3 of the third active pattern A3 according to the polarity of the power supplied to the shield line (SL), thereby controlling the threshold voltages of the first thin film transistor T1 and the third thin film transistor T3.

That is, the threshold voltages of the first and third thin film transistors T1 and T3 can be increased or reduced by using the shield line (SL), and the hysteresis that can occur at the first and third thin film transistors T1 and T3 can be improved by controlling the threshold voltages of the first and third thin film transistors T1 and T3, thereby improving the light emission efficiency of the OLED connected to the first thin film transistor T1.

The transistor characteristics of the first thin film transistor T1 that is a driving thin film transistor and the third thin film transistor T3 that is a complementary thin film transistor are improved by using the shield line (SL), such that the OLED display with improved emission efficiency of the OLED is provided.

Further, regarding the OLED display 200, the elements from the substrate (SUB) to the OLED can be manufactured, the strengthened substrate (SSU) on which the shield layer (SLA) can be provided is attached to the rear side of the substrate (SUB), and the shield layer (SLA) can be connected to the data driver (DD) on the substrate (SUB), thereby easily applying the shield layer (SLA) to the substrate (SUB). That is, the OLED display with improved manufacturing ease and improved light emission efficiency of the OLED is provided.

Figure 7:
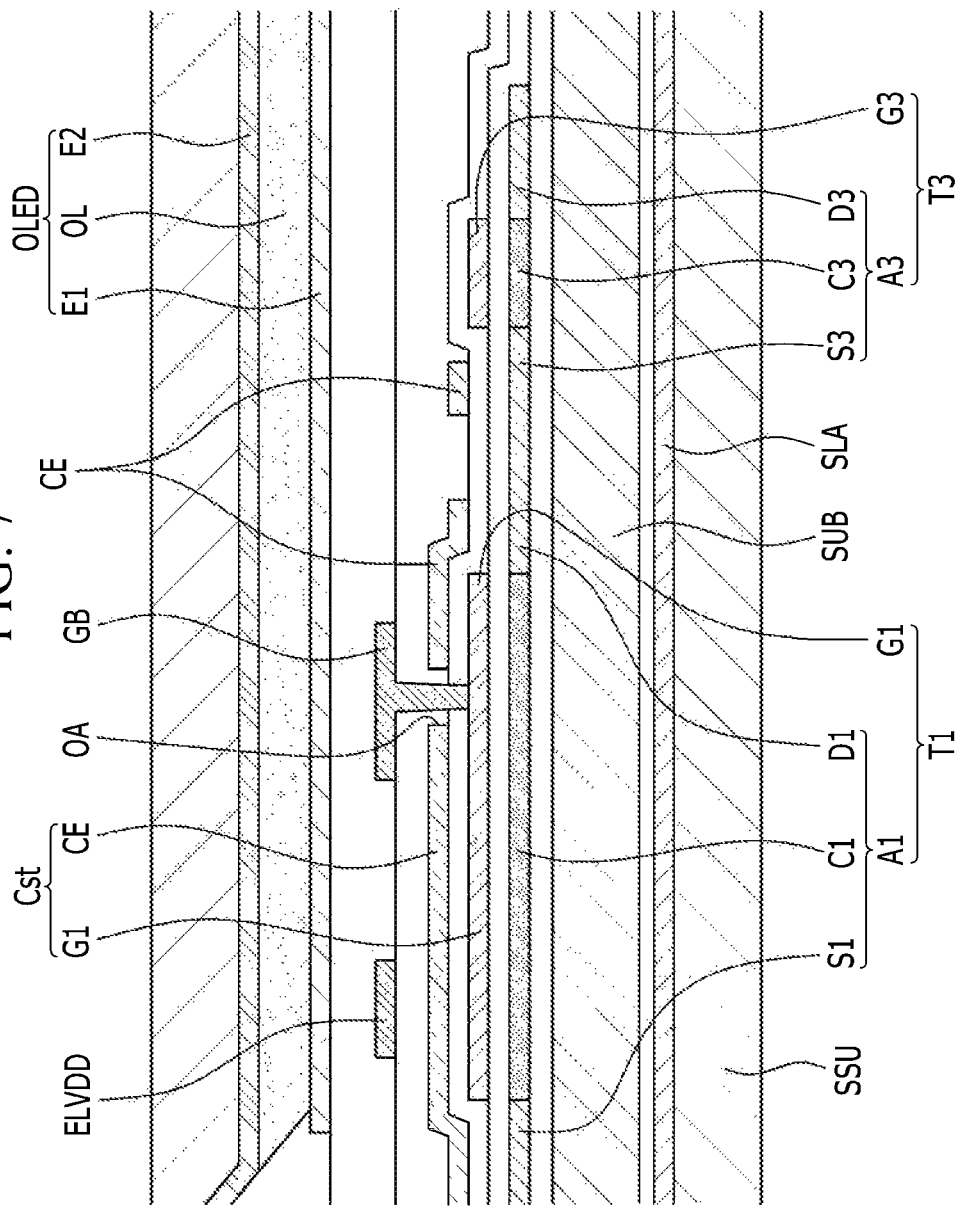
FIG. 7 shows a cross-sectional view of an OLED display according to another exemplary embodiment.

FIG. 7 shows a cross-sectional view of an OLED display according to another exemplary embodiment. Portions that are different from the OLED display will now be described.

As shown in FIG. 7, the OLED display includes a substrate (SUB), a plurality of pixels (PX), a plurality of gate wires (GW), a gate driver (GD), a plurality of data wires (DW), a data driver (DD), a shield layer (SLA), and a strengthened substrate (SSU).

The substrate (SUB) includes a display area (DIA) for displaying an image, and a non-display area (NDA) neighboring the display area (DIA). The substrate (SUB) can be provided on the strengthened substrate (SSU), and the substrate (SUB) can be attached to the strengthened substrate (SSU).

The strengthened substrate (SSU) is provided on a rear side of the substrate (SUB). The strengthened substrate (SSU) can be attached to the rear side of the substrate (SUB), but it is not limited thereto. The strengthened substrate (SSU) can be formed of a material that is different from the substrate (SUB), and without being limited thereto, it can be formed of the same material as the substrate (SUB).

The shield layer (SLA) is provided on the rear side of the substrate (SUB), and is provided between the substrate (SUB) and the strengthened substrate (SSU). The shield layer (SLA) has a single plate shape and is provided on the strengthened substrate (SSU) corresponding to the entire plate side of the substrate (SUB). The shield layer (SLA) can be connected to the substrate (SUB) through the contact hole formed in the substrate (SUB), and without being limited thereto, it can be connected to an external driver to receive power from the driver.

The shield layer (SLA) is provided between the substrate (SUB) and the strengthened substrate (SSU) corresponding to the first active pattern A1 of the first thin film transistor T1, and between the substrate (SUB) and the strengthened substrate (SSU) corresponding to the third active pattern A3 of the third thin film transistor T3.

The shield layer (SLA) to which power is supplied overlaps the first active pattern A1 of the first thin film transistor T1 and the third active pattern A3 of the third thin film transistor T3, and the OLED display can control the threshold voltages of the first and third thin film transistors T1 and T3, thereby improving the transistor characteristics of the first thin film transistor T1 and the third thin film transistor T3. Resultantly, the light emission efficiency of the OLED connected to the first thin film transistor T1 is improved.

Further, regarding the OLED display 300, the elements from the substrate (SUB) to the OLED are manufactured and the strengthened substrate (SSU) on which the shield layer (SLA) is generated is attached to the rear side of the substrate (SUB), thereby easily applying the shield layer (SLA) to the substrate (SUB). That is, the OLED display with improved manufacturing ease and improved light emission efficiency of the OLED is provided.

Also, regarding the OLED display 300, the shield layer (SLA) is provided on the rear side of the substrate (SUB) to block the impurity such as moisture permeating into the substrate (SUB) by using the shield layer (SLA), thereby controlling permeation of impurities such as moisture into the substrate (SUB).

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
   a substrate;
   a plurality of OLEDs provided over the substrate;
   a plurality of pixel circuits provided between the substrate and the OLEDs, wherein each of the pixel circuits comprises a plurality of transistors each including an active pattern electrically connected to the respective OLEDs; and
   a shield layer overlapping at least one of the active patterns of the transistors,
   wherein the transistors include:
      a first transistor including i) a first active pattern including a first channel provided over the substrate and ii) a first gate electrode provided over the first active pattern,
      a second transistor including a second active pattern electrically connected to the first active pattern and a second gate electrode provided over the second active pattern; and
      a third transistor including i) a third active pattern including a third channel configured to electrically connect the first active pattern and the first gate electrode and ii) a third gate electrode provided over the third active pattern, and
   wherein the shield layer overlaps the first channel of the first active pattern and the third channel of the third active pattern, and the shield layer does not overlap the second active pattern.

2. The OLED display of claim 1, wherein the shield layer includes a plurality of shield lines, and wherein the shield lines are spaced apart from each other in a first direction and extend in a second direction crossing the first direction.

3. The OLED display of claim 2, wherein the shield lines are electrically connected to each other.

4. The OLED display of claim 2, wherein the substrate includes:
   a display area comprising the OLEDs; and
   a non-display area surrounding the display area, and
   wherein the shield layer further includes a connection line extending in the first direction in the non-display area and electrically connected to the shield lines.

5. The OLED display of claim 4, wherein the substrate includes first and second sides opposing each other, wherein the OLEDs are provided over the first side, and wherein the shield layer is provided over the second side.

6. The OLED display of claim 5, further comprising a strengthened substrate provided over the second side of the substrate, wherein the shield layer is provided between the substrate and the strengthened substrate.

7. The OLED display of claim 6, wherein the substrate further includes a chamfered portion adjacent to an end of the strengthened substrate, and wherein the end of the strengthened substrate and a portion of the connection line do not overlap the substrate in the area adjacent to the chamfered portion.

8. The OLED display of claim 1, wherein the shield layer is provided between the substrate and the active patterns.

9. The OLED display of claim 1, wherein the shield layer comprises a plurality of shield lines at least two of which have different widths.

10. The OLED display of claim 1, wherein the shield layer is configured to receive power.

11. The OLED display of claim 1, further comprising a capacitor electrode overlapping the first gate electrode, wherein the capacitor electrode and the first gate electrode form a capacitor together, and wherein the shield layer overlaps the capacitor electrode.

12. The OLED display of claim 1, further comprising:
    a first scan line provided over the second active pattern, overlapping the second and third active patterns, and electrically connected to the second and third gate electrodes;
    a data line provided over the first scan line, crossing the first scan line, and electrically connected to the second active pattern; and
    a driving power supply line provided over the first scan line and spaced apart from the data line, wherein the driving power supply line crosses the first scan line and is electrically connected to the first active pattern.

13. The OLED display of claim 12, wherein the transistors further include a fourth transistor including i) a fourth active pattern electrically connected to the first gate electrode and the third active pattern and ii) a fourth gate electrode provided over the fourth active pattern, and
   wherein the OLED display further includes:
      a second scan line provided over the fourth active pattern, overlapping the fourth active pattern, and electrically connected to the fourth gate electrode; and
      an initialization power supply line provided over the second scan line and electrically connected to the fourth active pattern.

14. The OLED display of claim 13, wherein the transistors further include a seventh transistor including i) a seventh active pattern electrically connected to the fourth active pattern and ii) a seventh gate electrode provided over the seventh active pattern, and
   wherein the OLED display further includes a third scan line provided over the seventh active pattern, overlapping the seventh active pattern, and electrically connected to the seventh gate electrode.

15. The OLED display of claim 14, wherein the transistors further include:
   a fifth transistor including i) a fifth active pattern configured to electrically connect the first active pattern and the driving power supply line and ii) a fifth gate electrode provided over the fifth active pattern; and
   a sixth transistor including i) a sixth active pattern configured to electrically connect the first active pattern and the OLED and ii) a sixth gate electrode provided over the sixth active pattern, and
   wherein the OLED display further includes an emission control line provided over the fifth active pattern and the sixth active pattern, traversing the fifth and sixth active patterns, and electrically connected to the fifth and sixth gate electrodes.

16. The OLED display of claim 15, wherein the shield layer does not overlap at least one of the second, fourth, fifth, sixth, and seventh active patterns.

* * * * *